US012616067B2

(12) United States Patent
Lee et al.

(10) Patent No.: US 12,616,067 B2
(45) Date of Patent: Apr. 28, 2026

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Meng-Jie Lee, Taichung (TW); Chih-Nan Lin, Taichung (TW); Ci-Hong Yan, Taichung (TW); Nai-Hao Kao, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 431 days.

(21) Appl. No.: 18/155,337

(22) Filed: Jan. 17, 2023

(65) Prior Publication Data

US 2024/0145455 A1     May 2, 2024

(30) Foreign Application Priority Data

Oct. 28, 2022     (TW) .................................. 111141191

(51) Int. Cl.
H10W 90/00          (2026.01)
G02B 6/42          (2006.01)
          (Continued)

(52) U.S. Cl.
CPC .......... H10W 90/00 (2026.01); G02B 6/4245 (2013.01); G02B 6/4257 (2013.01); (Continued)

(58) Field of Classification Search
CPC ...... G02B 6/4201–4291; H01L 21/561; H01L 21/563; H01L 21/6835; H01L 21/50; H01L 21/56; H01L 23/3128; H01L 23/49838; H01L 23/49816; H01L 23/5389; H01L 23/13; H01L 23/3107; H01L 24/16; H01L 24/32; H01L 24/73; H01L 24/81; H01L 24/83; H01L 24/13; H01L 24/19; H01L 24/20; H01L 24/92; H01L 25/167; H01L 25/162; H01L 25/50; H01L 25/16; H10W 99/00; H10W 95/00; H10W 90/00; H10W 90/724; H10W 90/734; H10W 90/295; H10W 90/701; H10W 74/012; H10W 74/014; H10W 74/117; H10W 74/15; H10W 74/00; H10W 74/01;

(Continued)

(56)          References Cited

U.S. PATENT DOCUMENTS

| | | | |
|---|---|---|---|
| 8,938,136 B2 * | 1/2015 | Su ........................ | G02B 6/4244 |
| | | | 385/14 |
| 8,975,726 B2 * | 3/2015 | Chen ................. | H01L 21/76885 |
| | | | 257/532 |

(Continued)

*Primary Examiner* — Andres Munoz
(74) *Attorney, Agent, or Firm* — Studebaker Brackett PLLC

(57)          ABSTRACT

An electronic package is provided, in which an electronic module including a first electronic element and a second electronic element is disposed on a carrier structure embedded with a third electronic element, and the third electronic element is a photonic chip electrically connected to the electronic module. Therefore, with this configuration, it is beneficial to reduce a layout area of the carrier structure to meet the requirement of miniaturization.

16 Claims, 6 Drawing Sheets

(51) Int. Cl.

| | |
|---|---|
| *H10W 70/65* | (2026.01) |
| *H10W 74/01* | (2026.01) |
| *H10W 74/10* | (2026.01) |
| *H10W 74/15* | (2026.01) |
| *H10W 72/00* | (2026.01) |
| *H10W 74/00* | (2026.01) |

(52) U.S. Cl.

CPC .......... *G02B 6/4262* (2013.01); *H10W 70/65* (2026.01); *H10W 74/012* (2026.01); *H10W 74/014* (2026.01); *H10W 74/117* (2026.01); *H10W 74/15* (2026.01); *H10W 72/877* (2026.01); *H10W 74/00* (2026.01); *H10W 90/724* (2026.01); *H10W 90/734* (2026.01)

(58) Field of Classification Search

CPC ............. H10W 74/111; H10W 72/877; H10W 72/072; H10W 72/073; H10W 72/20; H10W 72/30; H10W 70/65; H10W 70/09; H10W 70/60; H10W 70/614; H10W 70/68; H10P 72/74; H10P 72/7424; H10P 72/743

See application file for complete search history.

(56) References Cited

U.S. PATENT DOCUMENTS

| | | | | |
|---|---|---|---|---|
| 10,025,047 | B1* | 7/2018 | Liu | ........................ H05K 1/11 |
| 2014/0262475 | A1* | 9/2014 | Liu | ................... H01L 21/4817 |
| | | | | 174/377 |
| 2016/0085038 | A1* | 3/2016 | Decker | ................. G02B 6/428 |
| | | | | 385/14 |
| 2018/0197842 | A1* | 7/2018 | Tokunari | ............ H01S 5/02326 |
| 2019/0287904 | A1* | 9/2019 | Seidemann | ............. H01L 24/17 |
| 2020/0402965 | A1* | 12/2020 | Ng | ........................ H01L 21/568 |
| 2021/0104637 | A1* | 4/2021 | Amano | ............... H05K 3/4688 |
| 2021/0132309 | A1* | 5/2021 | Zhang | ................. G02B 6/4249 |

* cited by examiner

ELECTRONIC PACKAGE AND MANUFACTURING METHOD THEREOF

BACKGROUND

1. Technical Field

The present disclosure relates to a semiconductor device, and more particularly, to an electronic package with a photonic element and a manufacturing method thereof.

2. Description of Related Art

In order to ensure the continued miniaturization and versatility of electronic products and communication equipment, semiconductor packages need to be miniaturized in size to facilitate multi-pin connections and have high functionality.

FIG. 1 is a schematic cross-sectional view of a conventional semiconductor package 1. As shown in FIG. 1, a switch die 12 and a light engine module 1a are disposed on a package substrate 18. The light engine module 1a includes an encapsulation layer 15, an electrical integrated circuit (EIC) chip 11 and conductive pillars 13 embedded in the encapsulation layer 15, a circuit structure 10 disposed on an upper side of the encapsulation layer 15, a wiring/routing structure 14 disposed on a lower side of the encapsulation layer 15, and a photo IC 16 (e.g., a photonic chip) disposed on the circuit structure 10, so that the light engine module 1a is disposed on the package substrate 18 by a plurality of conductive elements 17 with the routing structure 14 of the light engine module 1a, and the light engine module 1a is connected (e.g., externally connected) to an optical fiber 50 by the photo IC 16 thereof. In addition, a plurality of solder balls 19 can be arranged on the lower side of the package substrate 18.

However, in the conventional semiconductor package 1, the switch die 12 and the light engine module 1a are adjacently arranged on a layout of the package substrate 18, so that a large layout area of the package substrate 18 is occupied. As a result, it is difficult to reduce the layout area of the package substrate 18, and the semiconductor package 1 cannot meet the requirement of miniaturization.

Therefore, there is a need for a solution that addresses the aforementioned shortcomings in the prior art.

SUMMARY

In view of the aforementioned shortcomings of the prior art, the present disclosure provides an electronic package, which comprises: a carrier structure; an electronic module disposed on the carrier structure, wherein the electronic module comprises an encapsulation layer having a first surface and a second surface opposing the first surface, a first electronic element embedded in the encapsulation layer, conductive pillars embedded in the encapsulation layer, a circuit structure disposed on the first surface of the encapsulation layer and electrically connected to the first electronic element and the conductive pillars, and a second electronic element disposed on and electrically connected to the circuit structure; and a third electronic element embedded in the carrier structure and electrically connected to the electronic module, wherein the third electronic element is a photo IC.

The present disclosure further provides a method of manufacturing an electronic package, the method comprises: providing an electronic module, wherein the electronic module comprises an encapsulation layer having a first surface and a second surface opposing the first surface, a first electronic element embedded in the encapsulation layer, conductive pillars embedded in the encapsulation layer, a circuit structure disposed on the first surface of the encapsulation layer and electrically connected to the first electronic element and the conductive pillars, and a second electronic element disposed on and electrically connected to the circuit structure; electrically connecting a third electronic element to the electronic module, wherein the third electronic element is a photo IC; and disposing the electronic module on a carrier structure, wherein the third electronic element is embedded in the carrier structure.

In the aforementioned electronic package and method, the third electronic element is disposed on the second surface of the encapsulation layer via conductive bumps and is electrically connected to the conductive pillars.

In the aforementioned electronic package and method, the photo IC is connected to an optical fiber.

In the aforementioned electronic package and method, the carrier structure has a groove to accommodate the third electronic element.

In the aforementioned electronic package and method, the first electronic element or the second electronic element is a switch die. For example, the second electronic element is the switch die.

In the aforementioned electronic package and method, the electronic module further comprises a routing structure disposed on the second surface of the encapsulation layer and electrically connected to the conductive pillars. For example, the third electronic element is electrically connected to the routing structure.

In the aforementioned electronic package and method, the electronic module further comprises a packaging layer covering the second electronic element.

As can be understood from the above, in the electronic package and manufacturing method thereof according to the present disclosure, the layout area of the carrier structure occupied by the first electronic element to the third electronic element is reduced by embedding the third electronic element in the carrier structure and integrating the second electronic element in the electronic module. Therefore, compared with the prior art, the photo IC is embedded in the carrier structure, and the switch die is integrated into the electronic module in the present disclosure, so as to reduce the layout area of the carrier structure and meet the requirement of miniaturization.

DETAILED DESCRIPTION

Figure 1:
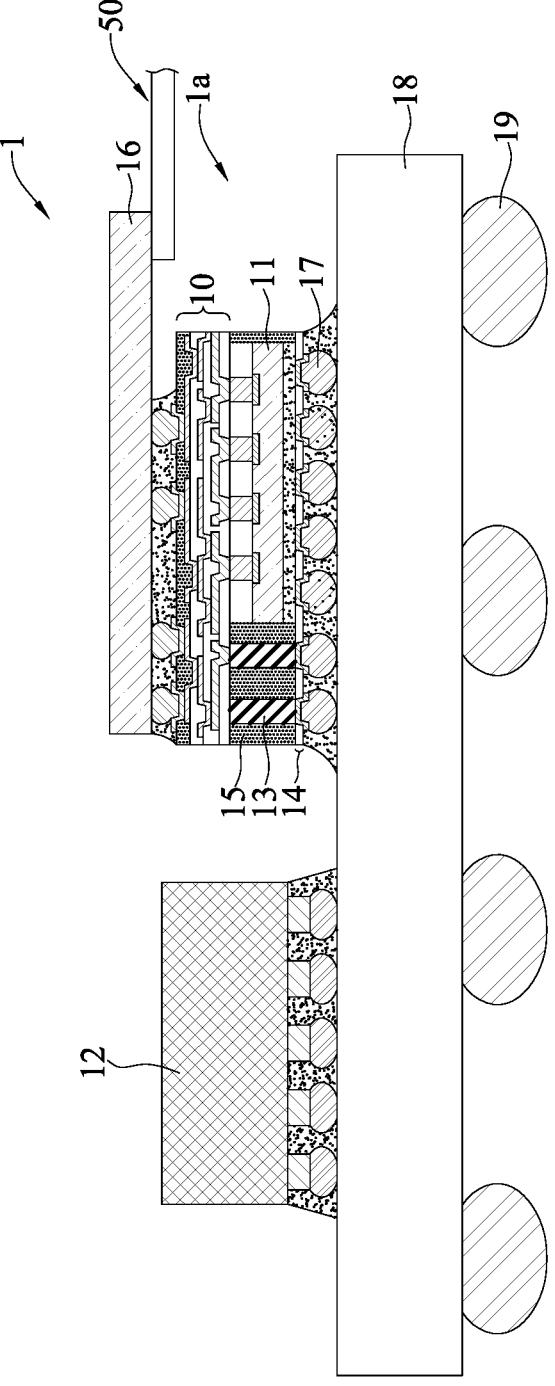
FIG. 1 is a schematic cross-sectional view of a conventional semiconductor package.

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as falling within the scope covered by the technical contents disclosed herein. Meanwhile, terms such as "above," "on," "first," "second," "one," "a," "an," and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

FIG. 2A to FIG. 2G are schematic cross-sectional views illustrating a method of manufacturing an electronic package 2 according to the present disclosure.

Figure 2A:
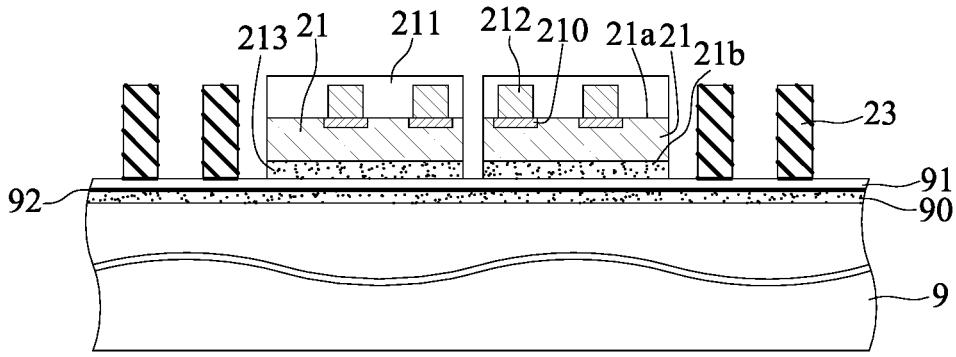
FIG. 2A to FIG. 2G are schematic cross-sectional views illustrating a method of manufacturing an electronic package according to the present disclosure.

As shown in FIG. 2A, a plurality of conductive pillars 23 are formed on a carrier 9, and at least one first electronic element 21 is disposed on the carrier 9. For example, in an embodiment, two first electronic elements 21 are shown in FIG. 2A, wherein the first electronic elements 21 are bonded and electrically connected to a plurality of conductors 212 (e.g., the plurality of conductors 212 are bonded on the first electronic elements 21).

The carrier 9 is, for example, a board body made of semiconductor material (such as silicon or glass), on which a release layer 90, a metal layer 92 (such as titanium/copper) and an insulating layer 91 (such as a dielectric material or a solder-resist material) are sequentially formed by, for example, coating, so that the conductive pillars 23 are disposed on the insulating layer 91.

Each of the first electronic element 21 is an active element, a passive element, or a combination of the active element and the passive element, wherein the active element may be a semiconductor chip, and the passive element may be a resistor, a capacitor, or an inductor.

In an embodiment, each of the first electronic elements 21 is a semiconductor chip, such as a driver or a trans impedance amplifier (TIA). Each of the first electronic elements 21 has an active surface 21a and an inactive surface 21b opposing the active surface 21a. Each of the first electronic elements 21 is adhered onto the insulating layer 91 by a bonding layer 213 with the inactive surface 21b. A plurality of electrode pads 210 and a protective film 211 made of such as a passivation material are formed on the active surface 21a, and the conductors 212 are formed in the protective film 211.

In addition, the material for forming the conductive pillars 23 is a metal material such as copper or a solder material, and the conductors 212 are conductive lines, spherical conductive members (such as solder balls), cylindrical metal conductive members (such as copper pillars, solder bumps, etc.), or stud conductive members made by a wire bonding machine, but the present disclosure is not limited to as such.

Figure 2B:
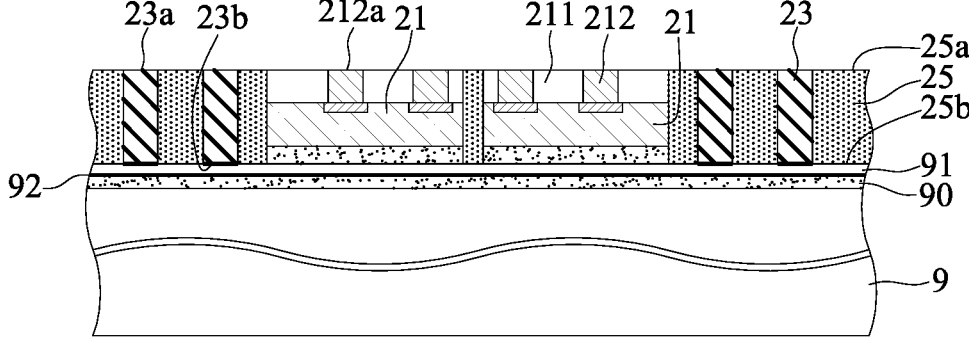

As shown in FIG. 2B, an encapsulation layer 25 is formed on the insulating layer 91 of the carrier 9, so that the first electronic elements 21 and the conductive pillars 23 are covered by the encapsulation layer 25, wherein the encapsulation layer 25 has a first surface 25a and a second surface 25b opposing the first surface 25a, wherein the protective film 211, end surfaces 212a of the conductors 212 and end surfaces 23a of the conductive pillars 23 are exposed from the first surface 25a of the encapsulation layer 25, and the encapsulation layer 25 is bonded onto the insulating layer 91 of the carrier 9 with the second surface 25b thereof.

In an embodiment, the encapsulation layer 25 is made from an insulating material, such as polyimide (PI), dry film, encapsulating colloid such as epoxy resin, or molding compound. For example, the encapsulation layer 25 can be formed on the insulating layer 91 by liquid compound, injection, lamination, or compression molding.

Moreover, the first surface 25a of the encapsulation layer 25 can be flush with the protective film 211, the end surfaces 23a of the conductive pillars 23 and the end surfaces 212a of the conductors 212 by a leveling process, so that the end surfaces 23a of the conductive pillars 23 and the end surfaces 212a of the conductors 212 are exposed from the first surface 25a of the encapsulation layer 25. For example, the leveling process removes part of the material of the protective film 211, part of the material of the conductive pillars 23, part of the material of the conductors 212 and part of the material of the encapsulation layer 25 by grinding.

Furthermore, end surfaces 23b of the conductive pillars 23 are also flush with the second surface 25b of the encapsulation layer 25.

Figure 2C:
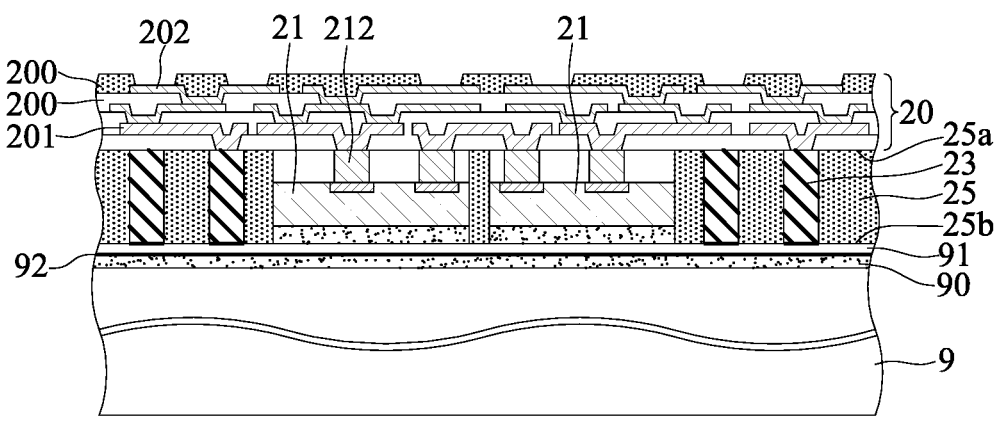

As shown in FIG. 2C, a circuit structure 20 is formed on the first surface 25a of the encapsulation layer 25, and the circuit structure 20 is electrically connected to the plurality of conductive pillars 23 and the conductors 212.

In an embodiment, the circuit structure 20 comprises a plurality of insulating layers 200 and a plurality of circuit layers or redistribution layers (RDLs) 201 disposed on the plurality of insulating layers 200. The outermost insulating layer 200 can be used as a solder-resist layer, and a part of the outermost redistribution layer 201 is exposed from the solder-resist layer to serve as electrical contact pads 202. Alternatively, the circuit structure 20 may only comprise a single insulating layer 200 and a single redistribution layer 201.

Furthermore, the material for forming the redistribution layers 201 is copper, and the material for forming the insulating layers 200 is dielectric material such as polybenzoxazole (PBO), polyimide (PI), prepreg (PP) and the like, or solder-resist material such as solder mask (e.g., green paint), graphite (e.g., ink), etc.

Figure 2D:
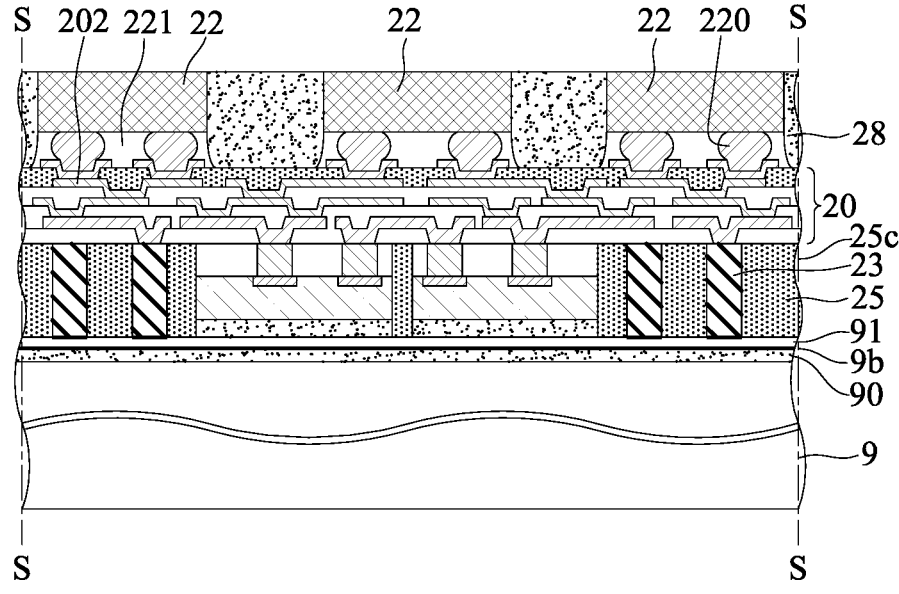

As shown in FIG. 2D, at least one second electronic element 22 is disposed on the circuit structure 20. For example, in an embodiment, three second electronic elements 22 are shown in FIG. 2D, wherein the second electronic elements 22 are electrically connected to the circuit structure 20, and then the second electronic elements 22 are encapsulated by a packaging layer 28.

In an embodiment, each of the second electronic elements 22 is a semiconductor chip, such as a switch die, a high bandwidth memory (HBM) chip, or an electrical integrated circuit (EIC) chip, or a chip with other functions. The second electronic elements 22 are electrically connected to the redistribution layers 201 of the circuit structure 20 by a plurality of conductive bumps 220 such as solder bumps, copper bumps, or other conductive bumps in a flip-chip manner. Alternatively, the second electronic elements 22 can be electrically connected to the redistribution layers 201 by a plurality of wires (not shown) in a wire-bonding manner. Therefore, there are many ways in which the second electronic elements 22 can be electrically connected to the redistribution layers 201, and the present disclosure is not limited to the above.

Moreover, the packaging layer 28 is made from an insulating material, such as polyimide (PI), dry film, encapsulating colloid such as epoxy resin, or molding compound, and the packaging layer 28 can be formed on the circuit structure 20 in a manner of lamination or molding. It should be understood that the material for forming the packaging layer 28 may be the same or different from the material for forming the encapsulation layer 25.

Furthermore, an upper surface of the packaging layer 28 can be flush with upper surfaces of the second electronic elements 22 by a leveling process, so that the upper surfaces of the second electronic elements 22 are exposed from the packaging layer 28. For example, the leveling process removes part of the material of the packaging layer 28 and part of the material of the second electronic elements 22 by grinding.

Also, an underfill 221 may be firstly formed between the circuit structure 20 and each of the second electronic elements 22 to cover the conductive bumps 220, and then the packaging layer 28 may be formed to cover the underfill 221 and the second electronic elements 22. Alternatively, the conductive bumps 220 may be directly covered by the packaging layer 28.

Figure 2E:
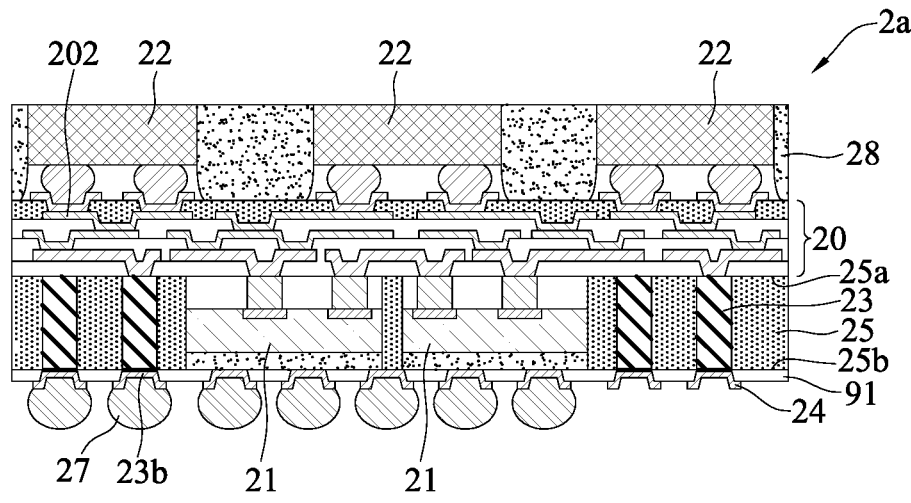

As shown in FIG. 2E, the carrier 9, the release layer 90 and the metal layer 92 are removed, and the insulating layer 91 is retained. Then, a wiring/routing structure 24 electrically connected to the plurality of conductive pillars 23 is formed on the insulating layer 91 to bond a plurality of conductive elements 27. Afterward, a singulation process is performed along cutting paths S shown in FIG. 2D to obtain a plurality of electronic modules 2a.

In an embodiment, the insulating layer 91 is formed with a plurality of openings by means of laser, so that the end surfaces 23b of the conductive pillars 23 are exposed from the openings to bond the routing structure 24. For example, the routing structure 24 may comprise an under bump metallization (UBM) layer to bond the conductive elements 27 such as a plurality of solder bumps or solder balls; alternatively, a routing structure comprising multi-layer circuits (not shown) may be formed by an RDL process on the insulating layer 91 to bond the conductive elements 27 or the UBM layer. It should be understood that there are various aspects of the routing structure 24, and the present disclosure is not limited to the above.

In addition, with the providing of the carrier 9 with the insulating layer 91, the routing structure 24 can be formed by using the insulating layer 91 after the carrier 9 is removed, so that no arrangement of the dielectric layer is required, and the process time and process steps can be reduced to achieve the purpose of reducing process costs.

Figure 2F:
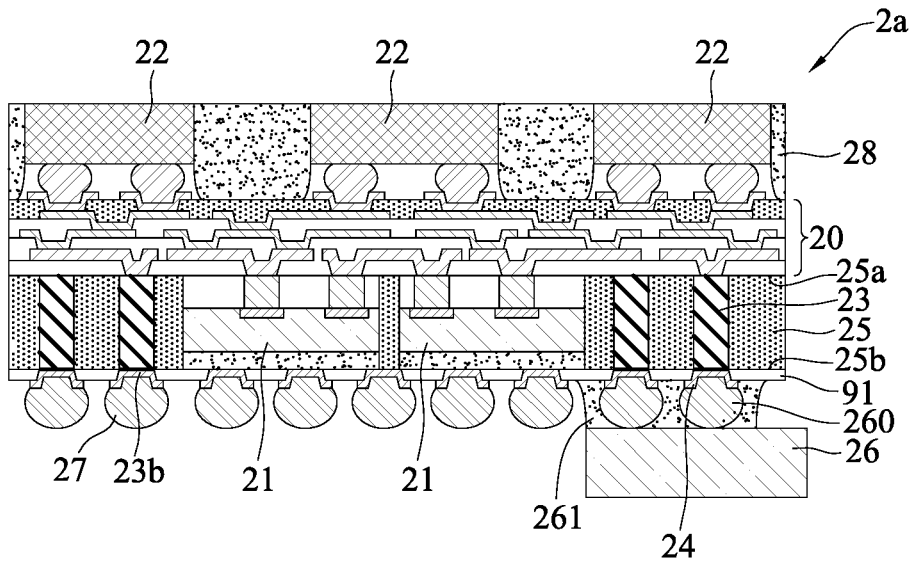
Figure 2G:
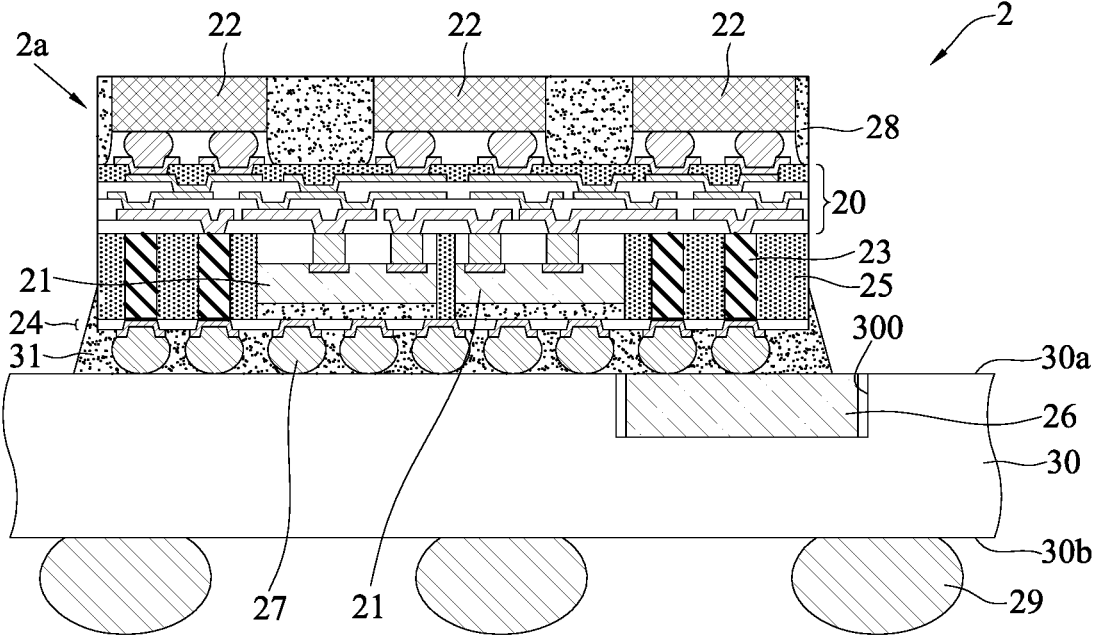
Figure 2H:
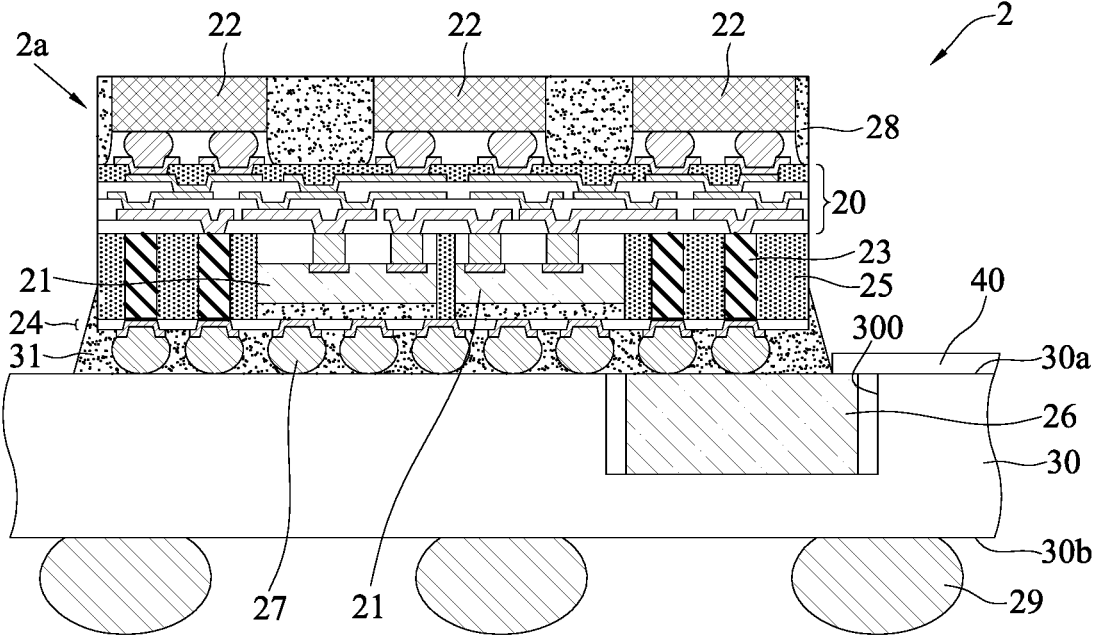
FIG. 2H is a schematic cross-sectional view showing an electronic package according to another embodiment of the present disclosure.

As shown in FIG. 2F, at least one third electronic element 26 such as a photo IC or a photonic chip is disposed on the routing structure 24 to connect (e.g., externally connect) a bus 40 such as an optical fiber cable (as shown in FIG. 2H) for signal transmission.

In an embodiment, the third electronic element 26 can be electrically connected to the routing structure 24 by a plurality of conductive bumps 260 (such as copper pillars, solder materials, etc.) in a flip-chip manner, and then the conductive bumps 260 are covered by an underfill 261; alternatively, the third electronic element 26 may directly contact the routing structure 24; or, the third electronic element 26 may be electrically connected to the routing structure 24 by a plurality of bonding wires (not shown) in a wire-bonding manner. It should be understood that there are many ways for the third electronic element 26 to be electrically connected to the routing structure 24, and the present disclosure is not limited to the above.

Moreover, signals can be transmitted between the third electronic element 26 and the second electronic element 22 by the routing structure 24, the conductive pillars 23 and the circuit structure 20.

As shown in FIG. 2G, the electronic module 2a is disposed on a carrier structure 30 having a groove 300 by the conductive elements 27, so that the third electronic element 26 is accommodated in the groove 300, and the third electronic element 26 is embedded in the carrier structure 30, thereby obtaining the electronic package 2 of the present disclosure.

In an embodiment, the carrier structure 30 is in the form of a substrate and has a first side 30a and a second side 30b opposing the first side 30a, wherein the electronic module 2a is disposed on the first side 30a of the carrier structure 30. For example, the carrier structure 30 is a package substrate with a core layer and a circuit structure or a coreless circuit structure, and the circuit structure comprises at least one insulating layer and at least one circuit layer bonded with the insulating layer (e.g., the circuit layer is a fan-out type RDL). It should be understood that the carrier structure 30 can also be other types of plate, such as a lead frame, a wafer, or a carrier with metal routings, etc., and the present disclosure is not limited to the above.

Furthermore, the conductive elements 27 are electrically connected to the carrier structure 30 and covered by an underfill 31.

Also, the second side 30b of the carrier structure 30 can be arranged with a plurality of solder balls 29 to connect to an electronic device (not shown) such as a circuit board.

In addition, in the subsequent process, the photo die or the third electronic element 26 can be connected (e.g., externally connected) to the bus 40 such as an optical fiber cable for signal transmission, as shown in FIG. 2H.

Therefore, in the manufacturing method of the present disclosure, the third electronic element 26 is embedded in the carrier structure 30, the second electronic elements 22 are integrated into the electronic module 2a, and the electronic module 2a and the third electronic element 26 are stacked on each other to reduce the layout area of the carrier structure 30 occupied by the first to third electronic elements 21, 22, 26. Therefore, compared with the prior art, the present disclosure embeds a photo IC (such as the third electronic element 26) in the carrier structure 30, and integrates switch dies (such as the second electronic elements 22) into the electronic module 2a, so as to reduce the layout area of the package substrate (such as the carrier structure 30). Therefore, the electronic package 2 can effectively meet the requirement of miniaturization.

It should be understood that one of the first and second electronic elements 21 and 22 can be used as a switch die, and the switch die is not limited to the above-mentioned second electronic element 22.

In addition, the number of the first to third electronic elements 21, 22, 26 may be designed according to requirements, so the photo IC and the switch die may be the first electronic element 21, the second electronic element 22, or the third electronic element 26 at the same time.

The present disclosure further provides an electronic package 2, which comprises: a carrier structure 30, an electronic module 2a disposed on the carrier structure 30, and a third electronic element 26 embedded in the carrier structure 30 and electrically connected to the electronic module 2a.

The electronic module 2a comprises an encapsulation layer 25, at least one first electronic element 21 embedded in the encapsulation layer 25, at least one conductive pillar 23 embedded in the encapsulation layer 25, a circuit structure 20 disposed on a first surface 25a of the encapsulation layer 25 and electrically connected to the first electronic element 21, and at least one second electronic element 22 disposed on the circuit structure 20 and electrically connected to the circuit structure 20, wherein the encapsulation layer 25 has the first surface 25a and a second surface 25b opposing the first surface 25a, so that the circuit structure 20 is disposed on the first surface 25a of the encapsulation layer 25, and the conductive pillars 23 are electrically connected to the circuit structure 20.

The third electronic element 26 is a photo IC.

In one embodiment, the third electronic element 26 is disposed on the second surface 25b of the encapsulation layer 25 via conductive bumps 260 and electrically connected to the conductive pillars 23.

In one embodiment, the photo IC is connected (e.g., externally connected) to an optical fiber.

In one embodiment, the carrier structure 30 has a groove 300 to accommodate the third electronic element 26. For example, the third electronic element 26 is a photo IC.

In one embodiment, the first electronic element 21 or the second electronic element 22 is a switch die. For example, the second electronic element 22 is the switch die.

In one embodiment, the electronic module 2a further comprises a routing structure 24 disposed on the second surface 25b of the encapsulation layer 25 and electrically connected to the conductive pillars 23. For example, the third electronic element 26 is electrically connected to the routing structure 24.

In one embodiment, the electronic module 2a further comprises a packaging layer 28 covering the second electronic element 22.

In view of the above, in the electronic package and manufacturing method thereof according to the present disclosure, the layout area of the carrier structure occupied by the first electronic element to the third electronic element is reduced by embedding the third electronic element in the carrier structure and integrating the first electronic element and the second electronic element in the electronic module. Therefore, the present disclosure can reduce the layout area of the carrier structure and meet the requirements of miniaturization.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
a carrier structure;
an electronic module disposed on the carrier structure, wherein the electronic module comprises an encapsulation layer having a first surface and a second surface opposing the first surface, a first electronic element embedded in the encapsulation layer, conductive pillars embedded in the encapsulation layer, a circuit structure disposed on the first surface of the encapsulation layer and electrically connected to the first electronic element and the conductive pillars, and at least two second electronic elements disposed on and electrically connected to the circuit structure, wherein the first electronic element is electrically connected to the at least two second electronic elements to serve as a bridge die, and a redistribution layer including an insulating layer and a routing structure is formed on a bottom side of the bridge die; and
a third electronic element embedded in the carrier structure and electrically connected to the electronic module, wherein the third electronic element is a photo IC, wherein the third electronic element is partially exposed from the carrier structure and the electronic module, and the exposed third electronic element is connected to an optical fiber disposed on the carrier structure.

2. The electronic package of claim 1, wherein the third electronic element is disposed on the second surface of the encapsulation layer via conductive bumps and is electrically connected to the conductive pillars.

3. The electronic package of claim 1, wherein the carrier structure has a groove to accommodate the third electronic element.

4. The electronic package of claim 1, wherein the first electronic element or one of the at least two second electronic elements is a switch die.

5. The electronic package of claim 4, wherein one of the at least two second electronic elements is the switch die.

6. The electronic package of claim 1, wherein the routing structure is disposed on the second surface of the encapsulation layer and electrically connected to the conductive pillars.

7. The electronic package of claim 6, wherein the third electronic element is electrically connected to the routing structure.

8. The electronic package of claim 1, wherein the electronic module further comprises a packaging layer covering the at least two second electronic elements.

9. A method of manufacturing an electronic package, comprising:
providing an electronic module, wherein the electronic module comprises an encapsulation layer having a first surface and a second surface opposing the first surface, a first electronic element embedded in the encapsulation layer, conductive pillars embedded in the encapsulation layer, a circuit structure disposed on the first surface of the encapsulation layer and electrically connected to the first electronic element and the conductive pillars, and at least two second electronic elements disposed on and electrically connected to the circuit structure, wherein the first electronic element is electrically connected to the at least two second electronic elements to serve as a bridge die, and a redistribution layer including an insulating layer and a routing structure is formed on a bottom side of the bridge die;
electrically connecting a third electronic element to the electronic module, wherein the third electronic element is a photo IC; and
disposing the electronic module on a carrier structure, wherein the third electronic element is embedded in the carrier structure, wherein the third electronic element is partially exposed from the carrier structure and the electronic module, and the exposed third electronic element is connected to an optical fiber disposed on the carrier structure.

10. The method of claim 9, wherein the third electronic element is disposed on the second surface of the encapsulation layer via conductive bumps and is electrically connected to the conductive pillars.

11. The method of claim 9, wherein the carrier structure has a groove to accommodate the third electronic element.

12. The method of claim 9, wherein the first electronic element or one of the at least two second electronic elements is a switch die.

13. The method of claim 12, wherein one of the at least two second electronic elements is the switch die.

14. The method of claim 9, wherein the routing structure is disposed on the second surface of the encapsulation layer and electrically connected to the conductive pillars.

15. The method of claim 14, wherein the third electronic element is electrically connected to the routing structure.

16. The method of claim 9, wherein the electronic module further comprises a packaging layer covering the at least two second electronic elements.

* * * * *